United States Patent
Lin et al.

(10) Patent No.: US 9,285,680 B2
(45) Date of Patent: Mar. 15, 2016

(54) PHOTOSENSITIVE POLYIMIDE COMPOSITION, BASE AGENT THEREOF, METHOD OF MAKING THE BASE AGENT, AND SOLDER-RESISTANT POLYIMIDE THIN FILM MADE FROM THE COMPOSITION

(71) Applicant: TAIFLEX SCIENTIFIC CO., LTD., Kaohsiung (TW)

(72) Inventors: Shih-Chang Lin, Kaohsiung (TW); Hsiu-Ming Chang, Kaohsiung (TW); Tzu-Ching Hung, Kaohsiung (TW)

(73) Assignee: Taiflex Scientific Co., Ltd., Kaohsiung (TW)

( * ) Notice: Subject to any disclaimer, the term of this patent is extended or adjusted under 35 U.S.C. 154(b) by 0 days.

(21) Appl. No.: 14/332,904

(22) Filed: Jul. 16, 2014

(65) Prior Publication Data

US 2016/0018733 A1 Jan. 21, 2016

(51) Int. Cl.
*G03F 7/027* (2006.01)
*G03F 7/038* (2006.01)
*C08F 283/04* (2006.01)
*C08L 79/08* (2006.01)
*C08L 77/06* (2006.01)
*C09J 179/08* (2006.01)

(52) U.S. Cl.
CPC ............ *G03F 7/0387* (2013.01); *C08F 283/04* (2013.01); *C08L 77/06* (2013.01); *C08L 79/08* (2013.01); *C09J 179/08* (2013.01); *C09J 2479/08* (2013.01)

(58) Field of Classification Search
CPC ......... C08L 79/08; C08L 77/06; C08L 63/00; C09J 179/08; C09J 2463/00; C09J 2479/08; G03F 7/027; G03F 7/037; G03F 7/038
USPC ................ 525/420, 436, 181, 423; 430/283.1
See application file for complete search history.

(56) References Cited

U.S. PATENT DOCUMENTS

| 7,220,484 B2 * | 5/2007 | Ton-That et al. .............. 428/407 |
| 8,362,151 B2 * | 1/2013 | Li et al. .......................... 525/180 |
| 2007/0141509 A1 * | 6/2007 | Jeng et al. ................... 430/270.1 |
| 2009/0182114 A1 * | 7/2009 | Kusaka et al. ................ 528/289 |
| 2012/0120972 A1 * | 5/2012 | Belenky et al. .................. 372/20 |
| 2012/0135251 A1 * | 5/2012 | Jeong et al. .................... 428/448 |
| 2012/0248632 A1 * | 10/2012 | Mitsukura et al. ............ 257/787 |
| 2014/0066590 A1 * | 3/2014 | Suzuki et al. ................. 528/363 |
| 2014/0342628 A1 * | 11/2014 | Jeol ............................... 442/181 |

FOREIGN PATENT DOCUMENTS

| TW | I265377 | 11/2006 |
| TW | I320514 | 2/2010 |
| TW | 201132692 | 10/2011 |
| TW | I374158 | 10/2012 |

\* cited by examiner

*Primary Examiner* — Amanda C Walke

(74) *Attorney, Agent, or Firm* — Fishman & Associates, LLC.

(57) ABSTRACT

A photosensitive polyimide composition; the composition comprises a base agent and a curing agent comprising a photoinitiator. By applying an aliphatic diamine monomer, which has a long carbon chain, and a grafting monomer, which has a main carbon chain having a double bond and an epoxy group at two ends respectively, to a method of making the base agent, a mixture of the base agent and the curing agent can be screen printed to form a photosensitive polyimide film on a copper foil. Also, the photosensitive polyimide film can be exposed under low exposure energy, and can be developed to a solder-resistant polyimide thin film by a weak alkaline developer after exposed. In addition, the solder-resistant polyimide thin film has low dielectric constant, low dielectric loss, good flame resistance, good solder resistance, and good pencil hardness. Accordingly, the photosensitive polyimide composition is applicable to high density flexible printed circuit boards.

19 Claims, No Drawings

PHOTOSENSITIVE POLYIMIDE COMPOSITION, BASE AGENT THEREOF, METHOD OF MAKING THE BASE AGENT, AND SOLDER-RESISTANT POLYIMIDE THIN FILM MADE FROM THE COMPOSITION

BACKGROUND OF THE INVENTION

1. Field of the Invention

The present invention relates to a photosensitive polyimide composition; especially relates a photosensitive polyimide composition for flexible printed circuit boards. In addition, the present invention relates to a base agent of the composition and a method of making the base agent. Also, the present invention relates to a solder-resistant polyimide thin film made from the composition.

2. Description of the Prior Art(s)

Although a conventional thin film made from a photosensitive solder-resistant composition having a base agent of epoxy resins is generally applicable to flexible printed circuit boards, the solder resistance, mechanical strength and flame resistance of the thin film cannot meet the needs of high density flexible printed circuit boards.

TWI320514 provides a negative photosensitive polyimide composition. But a high hard bake temperature around 230° C. is needed for the thin film made from the negative photosensitive polyimide composition. In addition, an ethanol solution comprising tetramethylazanium hydroxide (TMAH) serves as the developer for the thin film. Note that TMAH is not a common component of a developer used in the fabrication of printed circuit boards.

TWI265377 provides a negative photosensitive polyimide composition. But a high hard bake temperature around 230° C. is needed for the thin film made from the negative photosensitive polyimide composition. In addition, the thin film is not easy to be developed since the thin film is required to be developed by an ethanol solution comprising TMAH for 90 seconds and then be rinsed by ethanol for 30 seconds. Also, a high exposure energy around 1000 milli-joule per centimeter square ($mj/cm^2$) is needed for the thin film. Further, the dielectric constant and dielectric loss of the thin film is high after being developed; thereby the thin film cannot meet the needs of high density flexible printed circuit boards.

TWI374158 provides a photosensitive polyimide. Although shown to be a photosensitive polyimide, TWI374158 does not mention any relevant electrical property, thermal resistance, flexibility and chemical resistance, etc. Based on the specification of TWI374158, the photosensitive polyimide shall be a film. In this way, the photosensitive polyimide is needed to be laminated on a printed circuit board by an attaching machine, thereby causing poor sealing and storage stability problems.

Accordingly, conventional technique does not provide a photosensitive composition that can fabricate a thin film; a thin film has low hard bake temperature and low exposure energy and can be developed by a weak alkaline developer. In addition, the conventional developed thin film has high dielectric constant, high dielectric loss, weak flame resistance, weak solder resistance, and weak mechanical properties. Therefore, the conventional photosensitive composition and the thin film made from that do not meet the needs of high density flexible printed circuit boards.

To overcome the shortcomings, the present invention provides a photosensitive polyimide composition, a base agent of the photosensitive polyimide composition, a method for making the base agent, and a solder-resistant polyimide thin film made from the photosensitive polyimide composition to mitigate or obviate the aforementioned problems.

SUMMARY OF THE INVENTION

The main objective of the present invention is to provide a photosensitive polyimide composition, a base agent of the photosensitive polyimide composition, a method of making the base agent, and a solder-resistant polyimide thin film made from the photosensitive polyimide composition.

The method of making the base agent of the photosensitive polyimide composition in accordance with the present invention comprises the steps of:

polymerizing an aliphatic diamine monomer having a long carbon chain, another diamine monomer, a dianhydride monomer, and an anhydride monomer in an aprotic solvent to obtain a polyamine acid;

imidizing the polyamine acid to obtain a polyimide solution comprising a soluble polyimide; and grafting a grafting monomer having a main carbon chain to the soluble polyimide to obtain the base agent of the photosensitive polyimide composition, wherein each of two ends of the main carbon chain of the grafting monomer respectively has a double bond and an epoxy group.

In accordance with the method of making the base agent of the present invention, the long carbon chain of the aliphatic diamine monomer includes 6 to 40 carbons. In some embodiments, the aliphatic diamine monomer is hexamethylene diamine, heptamethylene diamine, octamethylene diamine, nonamethylene diamine, or decamethylene diamine.

In accordance with the method of making the base agent of the present invention, the step of grafting the grafting monomer to the soluble polyimide to obtain the base agent of the photosensitive polyimide composition comprises the steps of:

grafting the grafting monomer to the soluble polyimide to obtain a solution comprising a modified soluble polyimide; and mixing the solution comprising the modified soluble polyimide and a cross-linking agent to obtain the base agent of the photosensitive polyimide composition.

In the process of fabricating a film by the photosensitive polyimide composition, the cross-linking between the base agent and the curing agent is enhanced after the film is exposed to untraviolet; thereby an exposed region of the film is not easily dissolved by a developer.

Preferably, the cross-linking agent is selected from the group consisting of: trimethylolpropane triacrylate, pentaerythritol triacrylate, 1,6-hexanediol diacrylate, dipentylerythritol hexaacrylate, tri(propylene glycol)diacrylate and combinations thereof.

Preferably, a weight of the cross-linking agent ranges from 10 weight units to 40 weight units based on a weight of the modified soluble polyimide.

Preferably, the grafting monomer is selected from the group consisting of: glycidyl methacrylate, allyl glycidyl ether and a combination thereof.

Preferably, a weight of the grafting monomer ranges from 5 weight units to 15 weight units based on a weight of the soluble polyimide of the polyimide solution.

Preferably, said another diamine monomer is selected from the group consisting of: methylene bis(anthranilic acid), 3,5-diaminobenzoic acid, 1,3-bis(3-aminophenoxyl)benzene, 4,4'-oxydianiline, 2,2-bis[4-(4-aminophenoxy)phenyl]propane, 2,2-bis(3-amino-4-hydroxyphenyl)hexafluoropropane, 2,2'-bis(trifluoromethyl)benzidine and combinations thereof.

Preferably, the dianhydride monomer is selected from the group consisting of: 4,4'-oxydiphthalic dianhydride, 3,3',4,4'-benzophenone tetracarboxylic dianhydride, 3,3',4,4'-biphenyltetracarboxylic dianhydride, bicyclo[2.2.2]oct-7-ene-2,3,5,6-tetracarboxylic acid dianhydride, 4,4'-(hexafluoroisopropylidene)diphthalic anhydride and combinations thereof.

Preferably, the anhydride monomer comprises 1,2,4-benzenetricarboxylic anhydride.

Preferably, the aprotic solvent is selected from the group consisting of: n-methyl-2-pyrrolidone, dimethyl acetamide, dimethyl formamide, dimethyl sulfoxide, butyrolactone and combinations thereof.

Preferably, a molar sum of the dianhydride monomer and the anhydride monomer ranges from 0.85 mole to 0.95 mole based on a molar sum of the aliphatic diamine monomer having the long carbon chain and said another diamine monomer.

The base agent of the photosensitive polyimide composition in accordance with the present invention is made from the method mentioned above.

In accordance with the base agent of the photosensitive polyimide composition of the present invention, a solid content of the base agent ranges from 55 weight percent (wt %) to 60 wt % based on a weight of the base agent and a viscosity of the base agent ranges from 65000 centipoises (cP) to 75000 cP.

The photosensitive polyimide composition in accordance with the present invention comprises:
the base agent mentioned above; and,
a curing agent comprising a photoinitiator.

In accordance with the photosensitive polyimide of the present invention, the curing agent comprises a modifier to increase the cross-linking density between the base agent and the curing agent, thereby enhancing the thermal resistance and chemical resistance of the product made from the composition.

Preferably, the modifier is selected from the group consisting of: 1,3-phenylene-bis-oxazoline, epoxy resin and a combination thereof.

Preferably, the photoinitiator is selected from the group consisting of: phenyl bis(2,4,6-trimethylphenyl methyl)phosphine oxide, 2-benzyl-2-(dimethylamino)-1-[4-(4-morpholinyl)phenyl]-1-butanone and a combination thereof.

Preferably, a weight ratio between the base agent and the curing agent 23 ranges from 7:3 to 4:1.

The solder-resistant polyimide thin film in accordance with the present invention is made from the photosensitive polyimide composition mentioned above. The solder-resistant polyimide thin film has a dielectric constant less than 3 and a dielectric loss less than 0.02.

By the aliphatic diamine monomer, which has the long carbon chain, and the grafting monomer, which has the main carbon chain having the double bond and the epoxy group at two ends respectively, a mixture of the base agent made from the method of making the base agent of the photosensitive polyimide in accordance with the present invention and the curing agent comprising the photoinitiator can be screen printed to form a photosensitive polyimide film on a copper foil. Also, the photosensitive polyimide film can be exposed under an exposure energy of 500 mj/cm$^2$. The exposed photosensitive polyimide film can be developed to the solder-resistant polyimide thin film by a weak alkaline developer. In addition, the solder-resistant polyimide thin film has low dielectric constant, low dielectric loss, good flame resistance, good solder resistance, and good pencil hardness. Therefore, the photosensitive polyimide composition and the solder-resistant polyimide thin film made from the photosensitive polyimide composition in accordance with the present invention meet the needs of high density flexible printed circuit boards.

Other objectives, advantages, and novel features of the invention will become more apparent from the following detailed description when taken in conjunction with the accompanying drawings.

DETAILED DESCRIPTION OF THE PREFERRED EMBODIMENTS

Experiment 1

Making Base Agent of Photosensitive Polyimide Composition

Firstly, 67.89 grams of an aliphatic diamine monomer having a long carbon chain and 116.28 grams of another diamine monomer were dissolved in an aprotic solvent and a first solution was obtained. 120 grams of a dianhydride monomer was dissolved in the first solution under a temperature of 70° C. and stirred for 2 hours; then a second solution was obtained. 31.59 grams of an anhydride monomer was dissolved in the second solution under a temperature of 70° C. and stirred for 2 hours, and then a polyamine acid was obtained. In the present experiment, the long carbon chain of the aliphatic diamine monomer has 36 carbons. Said another diamine was methylene bis(anthranilic acid). The aprotic solvent was n-methyl pyrrolidone. The dianhydride monomer was 4,4'-oxydiphthalic dianhydride. The anhydride monomer was 1,2,4-benzenetricarboxylic anhydride. In addition, the ratio of the molar sum of the aliphatic diamine monomer having the long carbon chain and said another diamine monomer to the molar sum of the dianhydride monomer and the anhydride monomer was 1 to 0.9.

Secondly, 1.68 grams of triphenyl phosphine, 80 grams of toluene were mixed with the polyamine acid and a pre-reaction solution was obtained. The pre-reaction solution was processed in an imidizing reaction comprising three operation steps. The three operation steps were stirring the pre-reaction solution at 150° C. for 3 hours, stirring the pre-reaction solution at 160° C. for 1 hour, and stirring the pre-reaction solution at 170° C. for 1 hour in sequence. Triphenyl phosphine served as a catalyst and toluene served as an azeotropic agent. After the imidizing reaction, a polyimide solution comprising a soluble polyimide was obtained.

Thirdly, after 3.36 grams of triphenyl phosphine and 1.68 grams of hydroquinone were added into the polyimide solution comprising the soluble polyimide, the polyimide solution comprising the soluble polyimide was held at 95° C. and stirred for 0.5 hour; then a mixed solution was obtained. After 36.67 grams of glycidyl methacrylate was added into the mixed solution slowly, the mixed solution was held at 95° C. and stirred for 4 hours and then cooled, so that glycidyl methacrylate was grafted to the soluble polyimide and a solution comprising a modified soluble polyimide was obtained. The modified soluble polyimide was a glycidyl methacrylate grafted soluble polyimide. The weight of the glycidyl methacrylate was 10 weight units based on the weight of the soluble polyimide of the polyimide solution. In the present experiment, the formation of gel caused by the cross-linking of glycidyl methacrylate and the soluble polyimide was avoided by the use of hydroquinone.

Lastly, 8.4 grams of silica fume, 2.1 grams of pigment, 1.05 grams of triphenyl phosphine, 64 grams of cross-linking agent, 5 grams of defoamer and 420 grams of the solution comprising the modified soluble polyimide were stirred by a stirrer for 10 minutes to obtain a blend. The blend was dispersed by a triple roller dispersion machine and a base agent of a photosensitive polyimide composition was obtained. The base agent had a solid content around 57 wt % based on the weight of the base agent and a viscosity around 70000 cP. The cross-linking agent was trimethylolpropane triacrylate. The weight of the cross-linking agent was 25 weight units based on the weight of the modified soluble polyimide.

Experiment 2

Making Curing Agent of Photosensitive Polyimide Composition 31.5 grams of modifier and 42 grams of photoinitiator were dissolved in 137 grams of n-methyl pyrrolidone and stirred by the stirrer for 5 minutes; then a curing agent of a photosensitive polyimide composition was obtained. In the present experiment, the modifier was 1,3-phenylene-bis-oxazoline and the photoinitiator was phenyl bis(2,4,6-trimethylphenyl methyl)phosphine oxide.

Experiment 3

Application of Photosensitive Polyimide Composition

The photosensitive polyimide composition of the present experiment comprised the base agent of Experiment 1 and the curing agent of Experiment 2.

The base agent of Experiment 1 and the curing agent of Experiment 2 were mixed by a weight ratio of 7:3 and a photosensitive polyimide ink was obtained. The photosensitive polyimide ink had a solid content around 51 wt % and a viscosity around 15000 cP.

After screen printed on a surface of 0.5 oz/ft$^2$ copper foil, the photosensitive polyimide ink was soft baked by a hot air oven under 70° C. for 10 minutes and a photosensitive polyimide film was obtained on the cooper foil. The photosensitive polyimide film was 20 micrometers (μm) in thickness.

After a negative film was laid on a surface of the photosensitive polyimide film distal from the copper foil, the photosensitive polyimide film was exposed by an unfiltered light of a mercury arc lamp and an exposed photosensitive polyimide film was obtained. The energy of the unfiltered light of the mercury arc lamp was 500 mj/cm$^2$; the energy was equivalent to 5 steps to 7 steps of Stouffer 21-step tablet.

The exposed photosensitive polyimide film was sonicated by an ultrasonic oscillator and developed by a developer at 30° C. for 90 seconds; then a developed photosensitive polyimide film was obtained. The developer was a water solution comprising 1 volume percent (vol %) of sodium carbonate based on the volume of the water solution. The developed photosensitive polyimide film was rinsed by water for 30 seconds and a rinsed photosensitive polyimide film was obtained. The rinsed photosensitive polyimide film was blow-dried by an air gum and a blow-dried photosensitive polyimide film was obtained.

Afterwards, the blow-dried photosensitive polyimide film was hard-baked by a hot air circulating oven under 160° C. for 60 minutes and a solder-resistant polyimide thin film was obtained on the copper foil. The solder-resistant polyimide thin film was 19 μm in thickness. A resolution of pattern width and spacing on the solder-resistant polyimide thin film was observed and confirmed to be 50 μm by an optical microscopy Based on the above, the photosensitive polyimide ink made from the base agent of Experiment 1 and the curing agent of Experiment 2 was printed on the copper foil by screen printing. Therefore, the photosensitive polyimide composition of the present experiment was applicable to the fabrication of printed circuit boards.

In addition, since the exposure energy and the hard-baked temperature for the photosensitive polyimide film were respectively 500 mj/cm$^2$ and 160° C., which were much lower than 1000 mj/cm$^2$ and 230° C., the energy cost of fabrication of printed circuit boards were saved by the photosensitive polyimide film made from the photosensitive polyimide composition of the present experiment.

Also, the developer for the developing of the photosensitive polyimide film after exposing in the present experiment was the water solution comprising 1 vol % of sodium carbonate based on the volume of the water solution, indicating that a weak alkaline developer was applicable to the photosensitive polyimide film. Since the weak alkaline developer was commonly used in the fabrication of printed circuit boards, a specific developer that was not common in the fabrication of printed circuit boards was not required for developing the photosensitive polyimide film after exposing.

Test 1

The volume resistance, surface resistance, dielectric constant ($D_k$), dielectric loss ($D_f$), breakdown voltage, pencil hardness, solder resistance, flame resistance, acid endurance, alkali endurance and solvent endurance of the solder-resistant polyimide thin film of Experiment 3 were measured and evaluated. The results were shown in Table 1 and the measurement and evaluations were as follows.

The volume resistance was measured by the method of IPC-TM-650 2.5.17.1.

The surface volume resistance was measured by the method of IPC-TM-650 2.5.17.1.

The breakdown voltage was measured by the method of IPC-TM-650 2.5.6.

The dielectric constant and dielectric loss were measured by the method of IPC-TM-650 2.5.5.3.

The pencil hardness was measured by the method of IPC-TM-650 2.4.27.2.

According to the method A and method B of IPC-TM-650 2.2.13, the solder resistance was measured.

Based on the method A, the solder-resistant polyimide thin film was preheated and soldered afloat at 260° C. for 30 seconds. If solder-resistant polyimide thin film was not blistering, delaminating, or wrinkling, the solder-resistant polyimide thin film passed the solder resistance evaluations and had good solder resistance.

Based on the method B, the solder-resistant polyimide thin film was preheated and soldered afloat at 300° C. for 30 seconds. If the cured thermally curable solder-resistant layer was not blistering, delaminating, or wrinkling, the solder-resistant polyimide thin film passed the solder resistance evaluations and had good solder resistance.

The flame resistance was evaluated by UL94 VTM-0. If the cured solder-resistant polyimide thin film passed UL94 VTM-0, the solder-resistant polyimide thin film was regarded as having good flame resistance.

To evaluate the acid endurance, the solder-resistant polyimide thin film was immersed in 10 wt % hydrochloric acid (HCl) for 10 minutes. If there was no swelling, delamination, or color change after the immersing, the solder-resistant polyimide thin film passed the acid endurance evaluation and had good acid endurance.

To evaluate the alkali endurance, the solder-resistant polyimide thin film was immersed in 10 wt % sodium hydroxide (NaOH) for 10 minutes. If there was no swelling, delamination, or color change after the immersing, the solder-resistant polyimide thin film passed the alkali endurance evaluation and had good alkali endurance.

To evaluate the solvent endurance, the solder-resistant polyimide thin film was immersed in isopropyl alcohol ($C_3H_7OH$) and methyl ethyl ketone ($CH_3C(O)CH_2CH_3$) for 10 minutes. If there was no swelling, delamination, or color change after the immersing, the solder-resistant polyimide thin film passed the solvent endurance evaluation and had good solvent endurance.

Test 2

The photosensitive polyimide ink of Experiment 3 was coated on a surface of a polyimide membrane having a thickness of 0.5 mil and a photosensitive polyimide film was obtained. The photosensitive polyimide film of the present test was cured to a solder-resistant polyimide thin film and a specimen consisted of the solder-resistant polyimide thin film and the 0.5 mil thick polyimide membrane was obtained.

The specimen was folded and a bending portion was formed. A weight of 200 grams was placed on the bending portion. After removing the weight from the bending portion, the bending portion was checked. If there was no crack formed at the bending portion, the solder-resistant polyimide thin film had good bending resistance. The result was shown in Table 1.

TABLE 1

| the results of Test 1 and Test 2 | |
|---|---|
| Volume resistance | $2.12 \times 10^{15}$ Ω |
| Surface resistance | $6.09 \times 10^{13}$ Ω-cm |
| Dielectric constant | 2.98 |
| Dielectric loss | 0.012 |
| Breakdown voltage | 77.8 volt/μm |
| Pencil hardness | 2H |
| Bending resistance | no crack |
| Solder resistance (method A) | Passed |
| Solder resistance (method B) | Passed |
| Flame resistance | Passed |
| Acid endurance | Passed |
| Alkali endurance | Passed |
| Solvent endurance ($C_3H_7OH$) | Passed |
| Solvent endurance [$CH_3C(O)CH_2CH_3$] | Passed |

With reference to Table 1, since the solder-resistant polyimide thin film made from the photosensitive polyimide ink after screen printing, exposure, hard-baking, and development had a dielectric constant less than 3 and a dielectric loss less than 0.02, the solder-resistant polyimide thin film was applicable to high frequency electronic equipments.

With reference to Table 1, the solder-resistant polyimide thin film made from the base agent of Experiment 1 and the curing agent of Experiment 2 passed UL 94 VTM-0 test. In addition, the solder-resistant polyimide thin film passed solder resistance evaluation, acid endurance evaluation, alkali endurance evaluation and solvent endurance evaluation. Accordingly, the solder-resistant polyimide thin film had good chemical properties.

With reference to Table 1, the solder-resistant polyimide thin film made from the base agent of Experiment 1 and the curing agent of Experiment 2 had no crack after the weight was removed, indicating the solder-resistant polyimide thin film had good bending resistance.

To sum up, by the aliphatic diamine monomer, which has the long carbon chain, and the grafting monomer, which has the main carbon chain having the double bond and the epoxy group at two ends respectively, a mixture of the base agent made from the method of making the base agent of the photosensitive polyimide in accordance with the present invention and the curing agent comprising the photoinitiator can be screen printed to form a photosensitive polyimide film on a copper foil. Also, the photosensitive polyimide film can be exposed under an exposure energy of 500 mj/cm². The exposed photosensitive polyimide film can be developed to the solder-resistant polyimide thin film by a weak alkaline developer. In addition, the solder-resistant polyimide thin film has low dielectric constant, low dielectric loss, good bending resistance, good flame resistance, good solder resistance, and good pencil hardness. Therefore, the photosensitive polyimide composition, the photosensitive polyimide film, and the solder-resistant polyimide thin film made from the photosensitive polyimide composition all meet the needs of high density flexible printed circuit boards.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method of making a base agent of a photosensitive polyimide composition comprising the steps of:
   polymerizing an aliphatic diamine monomer having a long carbon chain, another diamine monomer, a dianhydride monomer, and an anhydride monomer in an aprotic solvent to obtain a polyamine acid, wherein the long carbon chain of the aliphatic diamine monomer includes 6 carbons to 40 carbons;
   imidizing the polyamine acid to obtain a polyimide solution comprising a soluble polyimide; and
   grafting a grafting monomer having a main carbon chain to the soluble polyimide to obtain the base agent of the photosensitive polyimide composition, wherein each of two ends of the main carbon chain of the grafting monomer respectively has a double bond and an epoxy group.

2. The method as claimed in claim 1, wherein the step of grafting the grafting monomer to the soluble polyimide to obtain the base agent of the photosensitive polyimide composition comprises the steps of:
   grafting the grafting monomer to the soluble polyimide to obtain a solution comprising a modified soluble polyimide; and
   mixing the solution comprising the modified soluble polyimide and a cross-linking agent to obtain the base agent of the photosensitive polyimide composition.

3. The method as claimed in claim 2, wherein the cross-linking agent is selected from the group consisting of: trimethylolpropane triacrylate, pentaerythritol triacrylate, 1,6-hexanediol diacrylate, dipentylerythritol hexaacrylate, tri(propylene glycol)diacrylate and combinations thereof.

4. The method as claimed in claim 2, wherein a weight of the cross-linking agent ranges from 10 weight units to 40 weight units based on a weight of the modified soluble polyimide.

5. The method as claimed in claim 1, wherein the grafting monomer is selected from the group consisting of: glycidyl methacrylate, allyl glycidyl ether and a combination thereof.

6. The method as claimed in claim 1, wherein a weight of the grafting monomer ranges from 5 weight units to 15 weight units based on a weight of the soluble polyimide of the polyimide solution.

7. The method as claimed in claim 1, wherein said another diamine monomer is selected from the group consisting of: methylene bis(anthranilic acid), 3,5-diaminobenzoic acid, 1,3-bis(3-aminophenoxyl)benzene, 4,4'-oxydianiline, 2,2-bis[4-(4-aminophenoxy)phenyl]propane, 2,2-bis(3-amino-4-hydroxyphenyl)hexafluoropropane, 2,2'-bis(trifluoromethyl)benzidine and combinations thereof.

8. The method as claimed in claim 1, wherein the dianhydride monomer is selected from the group consisting of: 4,4'-oxydiphthalic dianhydride, 3,3',4,4'-benzophenone tetracarboxylic dianhydride, 3,3',4,4'-biphenyltetracarboxylic dianhydride, bicyclo[2.2.2]oct-7-ene-2,3,5,6-tetracarboxylic acid dianhydride, 4,4'-(hexafluoroisopropylidene)diphthalic anhydride and combinations thereof.

9. The method as claimed in claim 1, wherein the anhydride monomer comprises 1,2,4-benzenetricarboxylic anhydride.

10. The method as claimed in claim 1, wherein the aprotic solvent is selected from the group consisting of: n-methyl-2-pyrrolidone, dimethyl acetamide, dimethyl formamide, dimethyl sulfoxide, butyrolactone and combinations thereof.

11. The method as claimed in claim 1, wherein a molar sum of the dianhydride monomer and the anhydride monomer ranges from 0.85 mole to 0.95 mole based on a molar sum of the aliphatic diamine monomer having the long carbon chain and said another diamine monomer.

12. A base agent of a photosensitive polyimide composition, the base agent made from the method as claimed in claim 1.

13. The base agent as claimed in claim 12, wherein a solid content of the base agent ranges from 55 wt % to 60 wt % based on a weight of the base agent and a viscosity of the base agent ranges from 65000 centipoises to 75000 centipoises.

14. A photosensitive polyimide composition comprising:
the base agent as claimed in claim 12; and
a curing agent comprising a photoinitiator.

15. The composition as claimed in claim 14, wherein the curing agent comprises a modifier.

16. The composition as claimed in claim 15, wherein the modifier is selected from the group consisting of: 1,3-phenylene-bis-oxazoline, epoxy resin and a combination thereof.

17. The composition as claimed in claim 14, wherein the photoinitiator is selected from the group consisting of: phenyl bis(2,4,6-trimethylphenyl methyl)phosphine oxide, 2-benzyl-2-(dimethylamino)-1-[4-(4-morpholinyl)phenyl]-1-butanone and a combination thereof.

18. The composition as claimed in claim 14, wherein a weight ratio between the base agent and the curing agent ranges from 7:3 to 4:1.

19. A solder-resistant polyimide thin film, the solder-resistant polyimide thin film made from the composition as claimed in claim 14, wherein the solder-resistant polyimide thin film has a dielectric constant less than 3 and a dielectric loss less than 0.02.

* * * * *